(12) United States Patent
Tsai et al.

(10) Patent No.: US 10,468,500 B1
(45) Date of Patent: Nov. 5, 2019

(54) FINFET FABRICATION METHODS

(71) Applicant: Taiwan Semiconductor Manufacturing Co., Ltd., Hsinchu (TW)

(72) Inventors: Chun Hsiung Tsai, Hsinchu County (TW); Cheng-Yi Peng, Taipei (TW); Yin-Pin Wang, Kaohsiung (TW); Kuo-Feng Yu, Hsinchu County (TW); Da-Wen Lin, Hsinchu (TW); Jian-Hao Chen, Hsinchu (TW); Shahaji B. More, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/024,506

(22) Filed: Jun. 29, 2018

(51) Int. Cl.
| | |
|---|---|
| *H01L 29/66* | (2006.01) |
| *H01L 21/265* | (2006.01) |
| *H01L 21/324* | (2006.01) |
| *H01L 21/768* | (2006.01) |
| *H01L 21/223* | (2006.01) |
| *H01L 21/8234* | (2006.01) |

(52) U.S. Cl.
CPC ........ *H01L 29/665* (2013.01); *H01L 21/2236* (2013.01); *H01L 21/2652* (2013.01); *H01L 21/26513* (2013.01); *H01L 21/324* (2013.01); *H01L 21/76802* (2013.01); *H01L 21/76804* (2013.01); *H01L 21/76825* (2013.01); *H01L 21/76831* (2013.01); *H01L 21/823418* (2013.01); *H01L 21/823431* (2013.01); *H01L 29/66515* (2013.01); *H01L 29/66795* (2013.01)

(58) Field of Classification Search
CPC ......... H01L 21/76804; H01L 21/76825; H01L 21/76831; H01L 21/823414; H01L 21/823418; H01L 29/665; H01L 29/66515; H01L 21/22; H01L 21/223; H01L 21/2236; H01L 21/26513; H01L 21/2652; H01L 21/324; H01L 29/66795; H01L 21/823431
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |

(Continued)

*Primary Examiner* — Thanhha S Pham
(74) *Attorney, Agent, or Firm* — Haynes and Boone, LLP

(57) ABSTRACT

A method and structure for doping source and drain (S/D) regions of a PMOS and/or NMOS FinFET device are provided. In some embodiments, a method includes providing a substrate including a fin extending therefrom. In some examples, the fin includes a channel region, source/drain regions disposed adjacent to and on either side of the channel region, a gate structure disposed over the channel region, and a main spacer disposed on sidewalls of the gate structure. In some embodiments, contact openings are formed to provide access to the source/drain regions, where the forming the contact openings may etch a portion of the main spacer. After forming the contact openings, a spacer deposition and etch process may be performed. In some cases, after performing the spacer deposition and etch process, a silicide layer is formed over, and in contact with, the source/drain regions.

20 Claims, 10 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2018/0151670 A1* | 5/2018 | Wu .................... H01L 21/2254 |

* cited by examiner

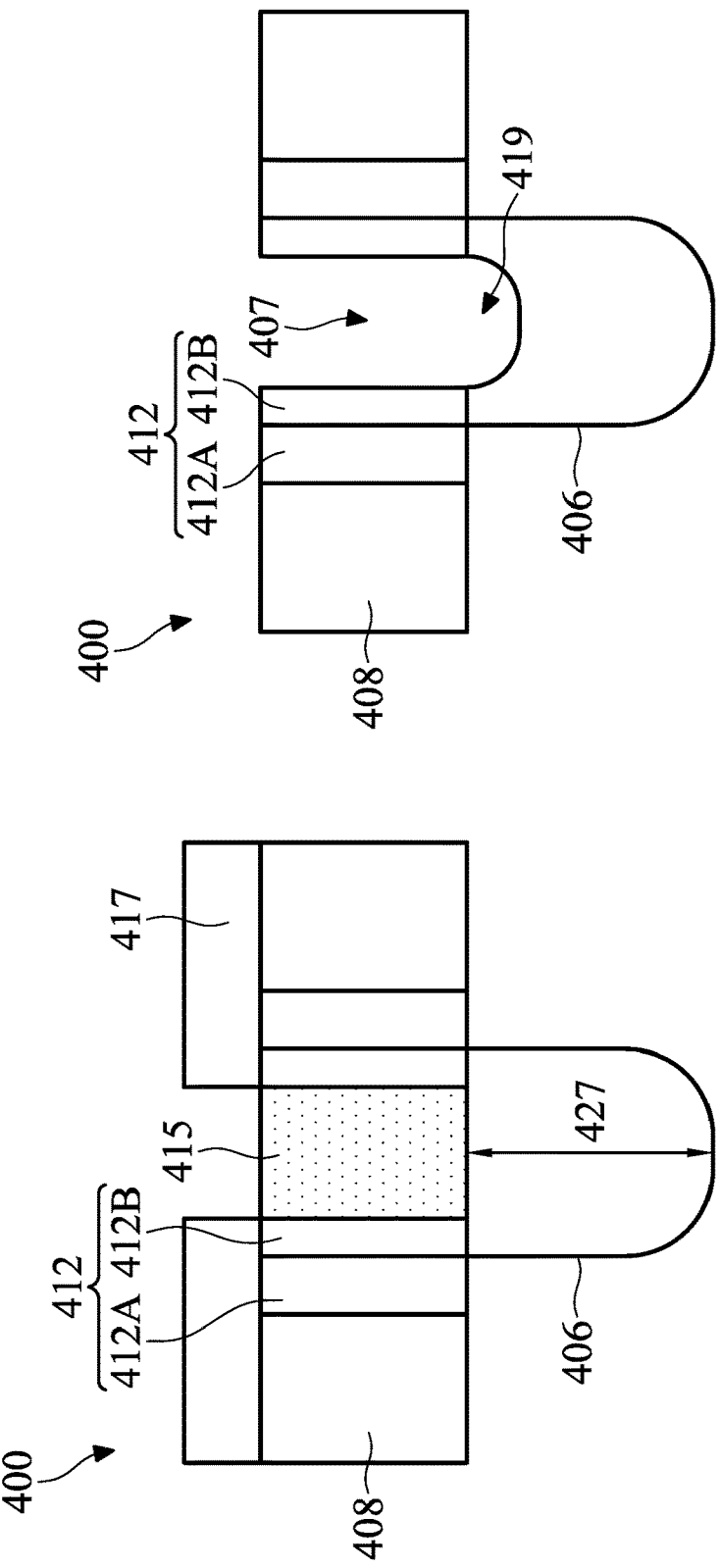

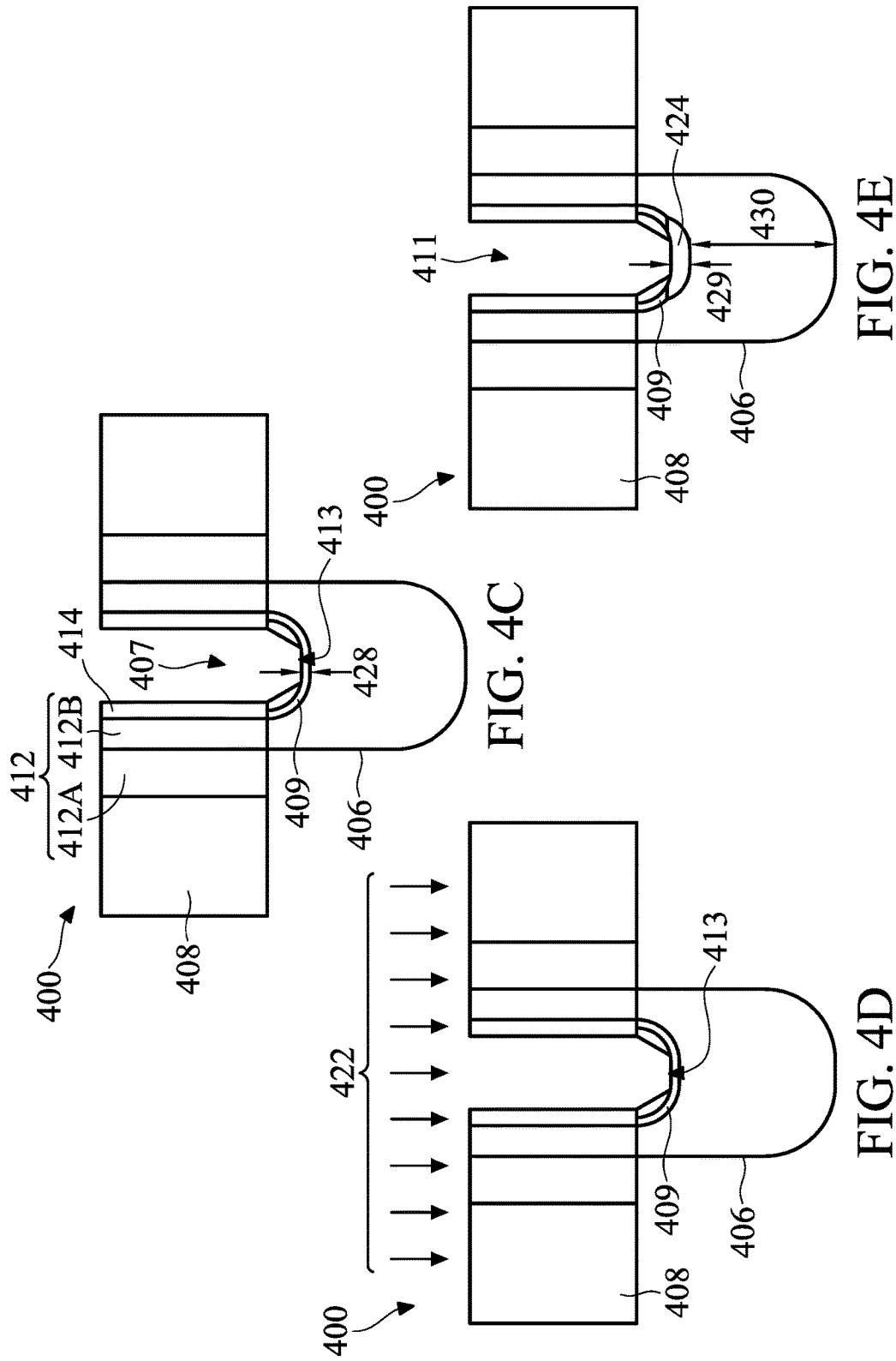

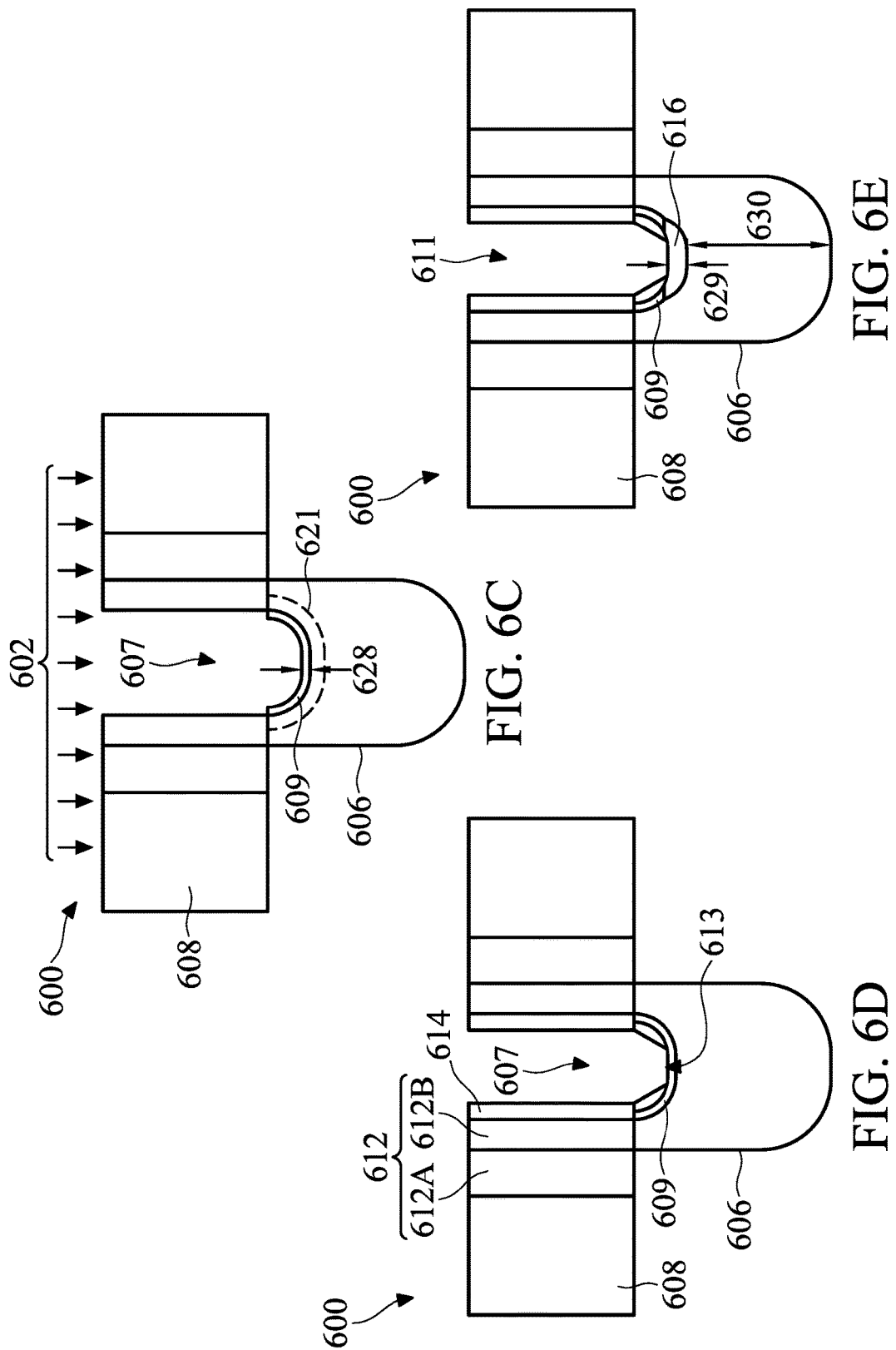

FINFET FABRICATION METHODS

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reducing OFF-state current, and reducing short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, such advanced devices also present new challenges. Indeed, one of the most pressing existing challenges is the reduction of source/drain contact resistance. In at least some examples, increased source/drain doping is used in an attempt to reduce contact resistance. However, source/drain ion implantation doping can result in dopant tailing, even when a pre-amorphization implant (PAI) is used, which can cause threshold voltage shift or other short-channel effects. For example, boron doping of PMOS source/drain regions may result in doping tailing and threshold voltage shift. For NMOS source/drain regions, which may be doped for example with phosphorous or arsenic, the benefits of reduced source/drain resistance by increased doping have been limited for instance by: (i) maximum dopant concentration achievable, (ii) NMOS dopant participation in subsequent silicide (e.g., TiSi) reaction/formation, and (iii) heavily doped source/drain induced short-channel effects.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 4B, 4C, 4D, and 4E provide cross-sectional views of an exemplary device fabricated according to one or more steps of the method 300 of FIG. 3;

FIGS. 6A, 6B, 6C, 6D, and 6E provide cross-sectional views of an exemplary device fabricated according to one or more steps of the method 500 of FIG. 5;

DETAILED DESCRIPTION

Figure 1:
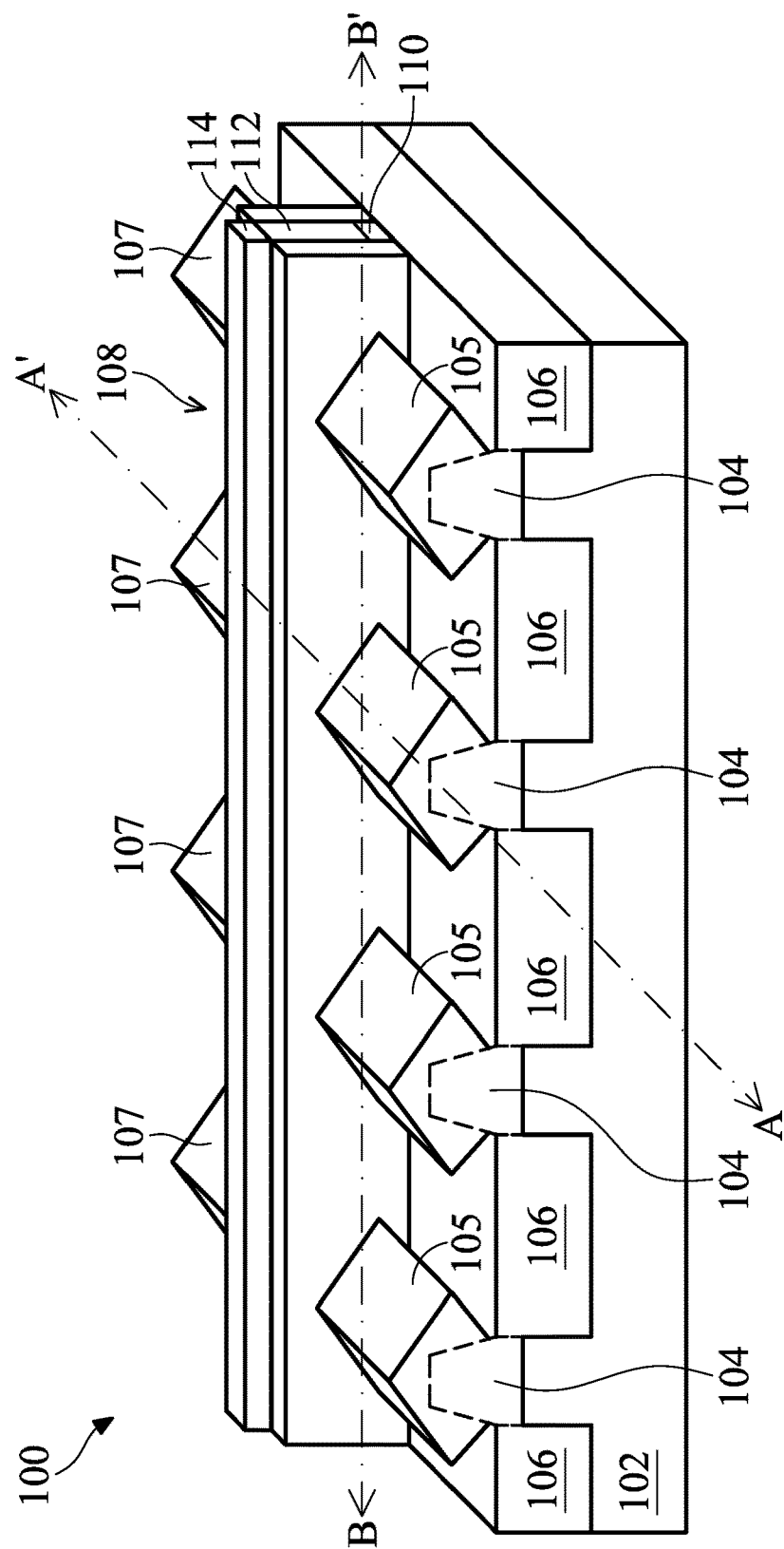
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an extreme ultraviolet (EUV) or electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section AA' of FIG. 1. In some examples, the channel region of the fin includes a high-mobility material such as germanium, and/or any of the compound semiconductors or alloy semiconductors discussed above including combinations thereof. High-mobility materials include those materials with an electron mobility greater than silicon. For example, higher than Si which has an intrinsic electron mobility at room temperature (300 K) of around 1350 $cm^2$/V-s and a hole mobility of around 480 $cm^2$/V-s.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having an interfacial layer 110 formed over the channel region of the fin 104, a gate dielectric layer 112 formed over the interfacial layer 110, and a metal layer 114 formed over the gate dielectric layer 112. The interfacial layer 110 may include a dielectric material such as silicon oxide layer ($SiO_2$) or silicon oxynitride (SiON). The interfacial layer 110 may be formed by chemical oxidation, thermal oxidation, atomic layer deposition (ALD), chemical vapor deposition (CVD), and/or other suitable method. The gate dielectric layer 112 may include a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 114 may include a conductive layer such as W, TiN, TaN, WN, Re, Ir, Ru, Mo, Al, Cu, Co, Ni, combinations thereof, and/or other suitable compositions. In some embodiments, the metal layer 114 may include a first metal material for N-type FinFETs and a second metal material for P-type FinFETs. Thus the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 114 may provide a gate electrode for the FinFET device 100, including both N-type and P-type FinFET devices 100. In some embodiments, the metal layer 114 may alternately include a polysilicon layer. The metal layer 114 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

As discussed above, one of the most pressing existing challenges for advanced semiconductor devices such as FinFETs is the reduction of source/drain contact resistance. In at least some examples, increased source/drain doping is used in an attempt to reduce contact resistance. However, source/drain ion implantation doping can result in dopant tailing, even when a pre-amorphization implant (PAI) is used, which can cause threshold voltage shift or other short-channel effects. For example, boron doping of PMOS source/drain regions may result in boron doping tailing and threshold voltage shift. For NMOS source/drain regions, which may be doped for example by ion implantation of phosphorous or arsenic, the benefits of reduced source/drain resistance by increased doping have been limited for instance by: (i) maximum dopant concentration achievable, (ii) NMOS dopant participation in subsequent silicide (e.g., TiSi) reaction/formation, and (iii) heavily doped source/drain induced short-channel effects. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods for doping FinFET source and drain (S/D) regions to provide a reduced S/D contact resistance without the drawbacks of existing methods. For example, in some embodiments, a spacer deposition-etch (dep-etch) process may be performed prior to a source/drain doping process in order to prevent dep-etch induced dopant loss (e.g., dep-etch induced boron dopant loss for PMOS devices). In some cases, a plasma doping (PLAD) process may be used to perform the source/drain doping process, rather than using a conventional ion implantation process. In various embodiments, the PLAD process may include a boron PLAD process. By way of example, the PLAD process may provide for self-amorphization, surface peak concentration, and an abrupt doping profile, thereby resolving the tailing issue described above. Thus, embodiments disclosed herein eliminate the need for an additional Ge amorphization process step, as used in at least some conventional ion implantation processes. In addition, the PLAD process provides for faster processing time, as compared to conventional ion implantation, because of the higher dose rate of the PLAD process. Generally, various embodiments of the present disclosure provide for a reduction in source/drain contact resistance, but without the threshold voltage shift or other short channel effects that may be observed in conventionally processed devices. Separately, and in addition, some embodiments of the present disclosure use a P-type dopant (e.g., indium) for NMOS devices, such that the P-type dopant may be implanted into both N-type and P-type regions simultaneously, thereby obviating the need for an extra mask during the doping process. In various cases, using indium as a dopant provides other advantages such as: (i) indium is generally insoluble in silicon and will diffuse out of silicon, thereby avoiding undesirable counter-doping and preventing the possible formation of a doped silicide layer (e.g., doped TiSi layer), (ii) indium-implanted surfaces provide a diffusion barrier for at least some dopants such as arsenic and phosphorous, thereby mitigating the formation of arsenic- or phosphorous-doped silicide (e.g., TiSi), and (iii) indium does not form a stable compound with titanium and acts as a catalyst for achieving a low-resistance TiSi phase transformation. In general, and in some cases, embodiments of the present disclosure provide for about a 10-20% reduction in contact resistance as compared to existing methods. In some embodiments, for example when utilizing indium as a dopant, the contact resistance of an NMOS device may be reduced by about 20%. In addition, because indium atoms are relatively large (e.g., as compared to Si), self-amorphization by the indium implantation process eliminates the need for a separate Ge amorphization process step for silicide formation (e.g., for TiSi formation). Additional embodiments and advantages are discussed below and/or will be evident to those skilled in the art in possession of this disclosure.

Figure 2:
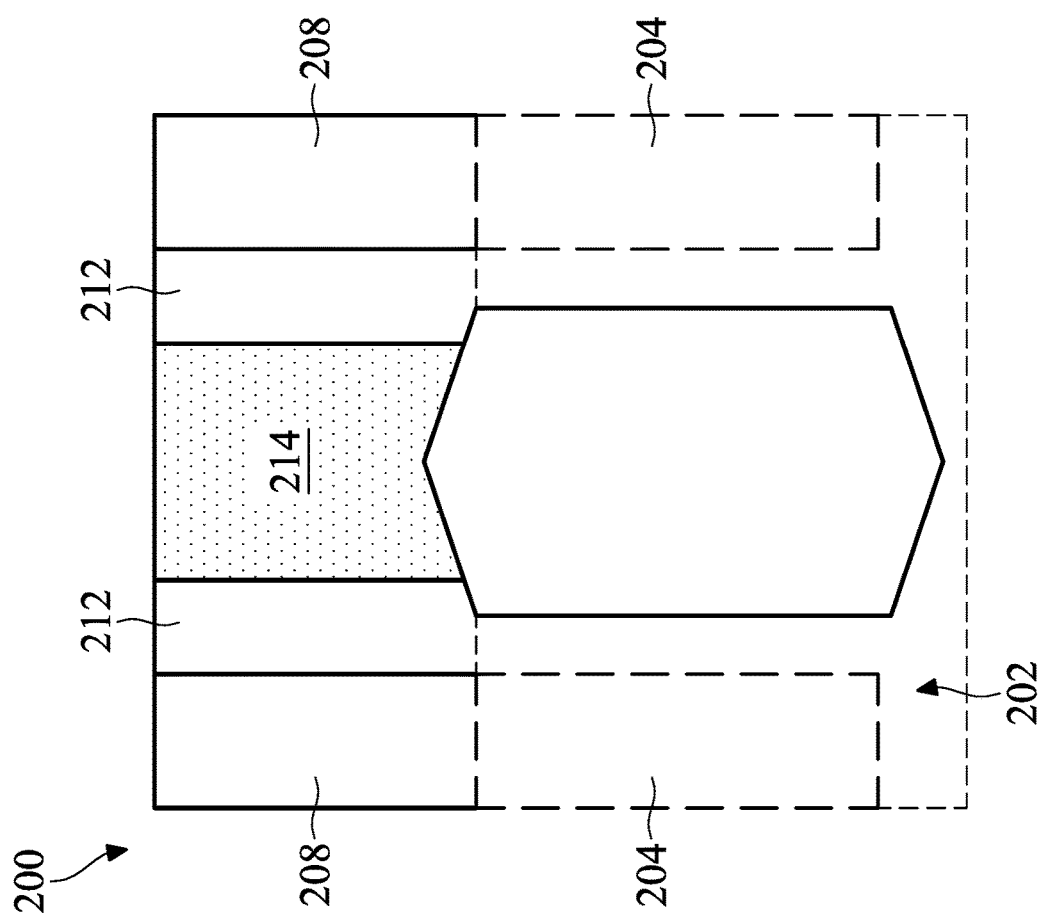
FIG. 2 illustrates a cross-sectional view of an embodiment of a FinFET device along a section AA' of FIG. 1.

For purposes of discussion of at least some of the various embodiments, reference is now made to the example of FIG. 2, which shows a semiconductor device 200 which provides a cross-sectional view substantially similar to section AA' of FIG. 1. As shown, the device 200 includes a semiconductor substrate from which a fin element 202 extends. The device 200 further illustrates channel regions 204 within the fin element 202 of neighboring FinFET devices and a source/drain feature 206 disposed between the channel regions 204. In various embodiments, the device 200 further includes a gate structure 208 disposed over each of the channel regions 204. In some embodiments, a nitride layer is formed over each of the gate structures 208. In some examples, such a nitride layer may be referred to as a sacrificial layer. Sidewall spacers 212, substantially similar to those described above with reference to the device 100 of FIG. 1 and in some cases including a plurality of layers, may also be formed on sidewalls of the gate structures 208. By way of example, the source/drain feature 206 may be formed by epitaxially growing a semiconductor material layer (e.g., over the fin element 202). In various embodiments, the semiconductor material layer used to form the source/drain feature 206 may include Ge, Si, SiGeB, GaAs, AlGaAs, SiGe, GaAsP, SiP, or other suitable material. The source/drain feature 206 may be formed by one or more epitaxial (epi) processes. In some embodiments, a material used for the source/drain feature 206 may be the same or different than a material used for the adjacent channel regions 204.

In some embodiments, the source/drain feature 206 may be in-situ doped during the epi process. For example, in some embodiments, an epitaxially grown SiGe source/drain feature 206 may be doped with boron to form SiGeB. In some embodiments, an epitaxially grown Si epi source/drain feature 206 may be doped with carbon to form a Si:C source/drain feature, phosphorous to form a Si:P source/drain feature, or both carbon and phosphorous to form a SiCP source/drain feature. In some embodiments, the source/drain feature 206 is not in-situ doped, and instead an ion implantation process is performed to dope the source/drain feature 206. However, in accordance with at least some embodiments, a PLAD process is used to dope the source/drain feature 206, thereby avoiding some of the challenges associated with ion implantation, as discussed above. In some embodiments, formation of the source/drain feature 206 may be performed in separate processing sequences for each of N-type and P-type source/drain feature 206. However, in at least some cases (e.g., when using indium as a dopant for both N- and P-type devices), formation of the source/drain feature 206 may be done simultaneously for both N- and P-type devices. In some embodiments, after formation of the source/drain feature 206, an epi anneal process may be performed.

Still referring to FIG. 2, an interlayer dielectric (ILD) layer 214 may be formed over the device 200. In some embodiments, a contact etch stop layer (CESL) may also be formed prior to forming the ILD layer 214. In some examples, the CESL includes a silicon nitride layer, silicon oxide layer, a silicon oxynitride layer, and/or other materials known in the art. The CESL may be formed by plasmaenhanced chemical vapor deposition (PECVD) process and/or other suitable deposition or oxidation processes. In some embodiments, the ILD layer 214 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 214 may be deposited by a PECVD process or other suitable deposition technique. In some embodiments, after formation of the ILD layer 214, the semiconductor device 200 may be subject to an anneal process, for example, to anneal the ILD layer 214. In some examples, a planarization process (e.g., a CMP process) may be performed to planarize a top surface of the semiconductor device 200.

In various examples, and in order to make contact to the source/drain feature 206, an opening may be formed within the ILD layer 214 to provide access to the source/drain feature 206. For example, an opening may be formed by a suitable combination of lithographic patterning and etching (e.g., wet or dry etching) processes of the ILD layer 214. Conventionally, formation of the contact opening causes spacer loss (e.g., spacer 212), which can result in a gate-to-source/drain short. To mitigate this issue, at least some embodiments of the present disclosure provide for performing a spacer deposition-etch (dep-etch) process prior to a source/drain doping process to mitigate spacer loss and in order to prevent dep-etch induced dopant loss (e.g., dep-etch induced boron dopant loss for PMOS devices). In addition, at least some embodiments of the present disclosure utilize a PLAD process to perform the source/drain doping process, rather than using a conventional ion implantation process. In various embodiments, the PLAD process may provide for self-amorphization, surface peak concentration, and an abrupt doping profile, thereby resolving the tailing issue observed in conventional ion implantation processes.

Figure 3:
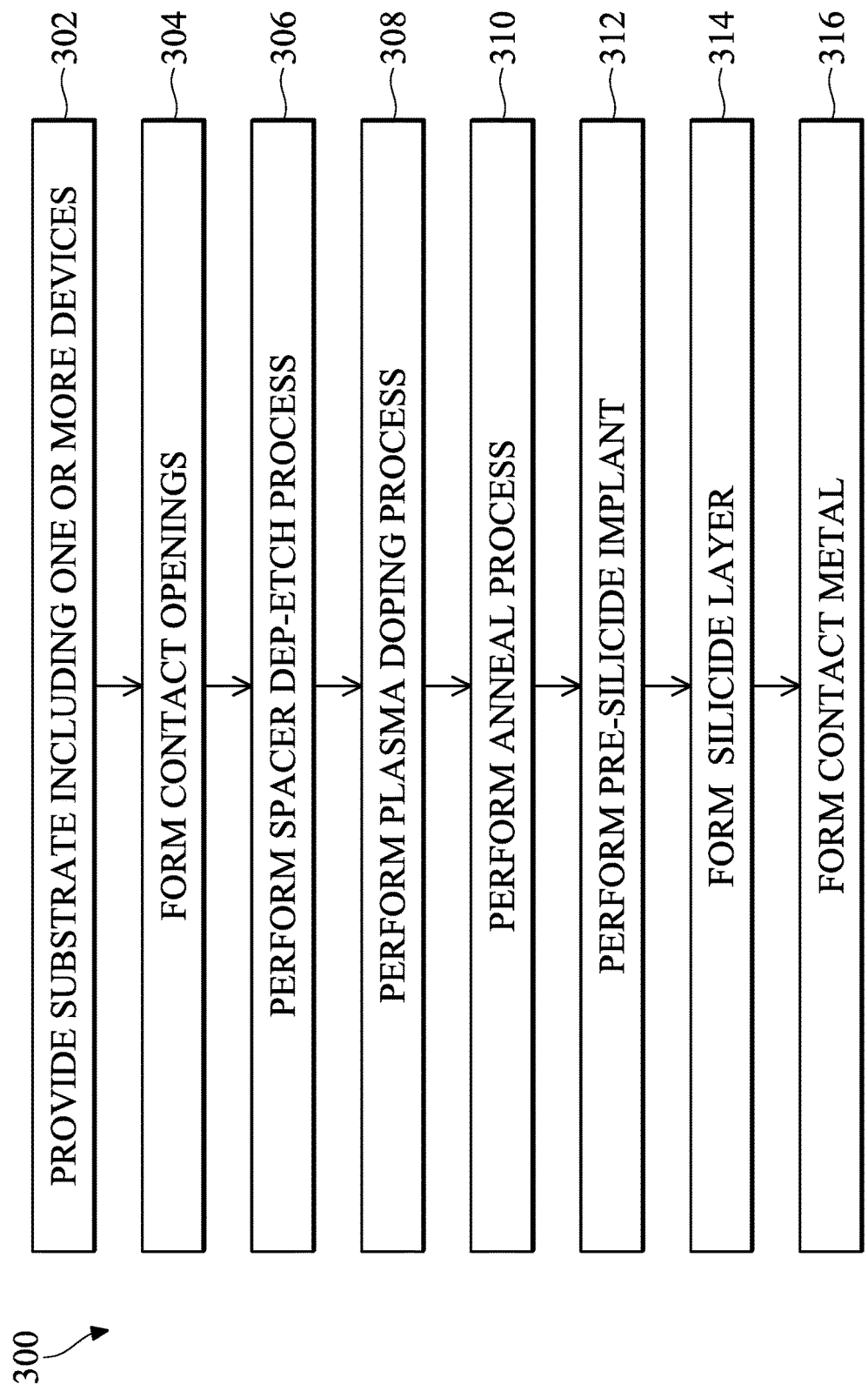
FIG. 3 is a flow chart of a method of fabricating a FinFET device according to one or more aspects of the present disclosure.

Referring now to FIG. 3, illustrated is a method 300 of fabricating a semiconductor device including a FinFET device. In particular, the method 300 provides methods for doping source and drain (S/D) regions of a PMOS FinFET device to provide a reduced S/D contact resistance between subsequently formed silicide and metal contact layers. In some embodiments, the method 300 may be used to fabricate the device 100, described above with reference to FIG. 1. Thus, one or more aspects discussed above with reference to the device 100 may also apply to the method 300. Additionally, FIGS. 4A-4E provide cross-sectional views of an exemplary device 400 fabricated according to one or more steps of the method 300 of FIG. 3.

It is understood that parts of the method 300 and/or the semiconductor device 400 may be fabricated by a well-known complementary metal-oxide-semiconductor (CMOS) technology process flow, and thus some processes are only briefly described herein. In addition, as described above, the device 400 may share aspects of the device 100, thus some aspects and/or processes of the device 400 are only discussed briefly for purposes of clarity in understanding. Also, the device 400 may share aspects of the device 200 described above, including both physical features and processing methods, thus some aspects and/or processes of the device 400 are only discussed briefly for purposes of clarity in understanding. Further, the semiconductor device 400 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 400 includes a plurality of semiconductor devices (e.g., transistors), which may be interconnected.

In various embodiments, the device 400 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring now to the method 300, the method 300 begins at block 302 where a substrate including one or more devices is provided. In some embodiments, the one or more devices may include one or more FinFET devices having fin elements extending from the substrate, isolation regions to separate the one or more FinFET devices, a gate structure formed over a channel region of the fin elements, a main sidewall spacer formed on sidewalls of the gate structure, an ILD layer, and a source/drain feature. The substrate may be substantially similar to the substrate 102 discussed above with reference to FIG. 1. The fins and isolation regions may also be substantially similar to the fin elements 104 or 202 and isolation regions 106, also described above with reference to the device 100 of FIG. 1 and the device 200 of FIG. 2. Additionally, the gate structure may be substantially similar to the gate structure 108 described above with reference to the device 100 of FIG. 1 or the gate structure 208 described above with reference to the device 200 of FIG. 2. In some cases, a nitride layer may also be formed over the gate structure. The main sidewall spacer may be substantially similar to the sidewall spacer formed on sidewalls of the gate structure 108 (FIG. 1) or to the sidewall spacers 212 (FIG. 2). In some cases, the ILD layer may be substantially similar to the ILD layer 214 and may include a CESL layer deposited prior to the ILD layer. Further, in some examples, the source/drain feature may be substantially similar to the source/drain regions 105, 107 (FIG. 1) or to the source/drain feature 206 (FIG. 2). Referring to the example of FIG. 4A, the device 400 illustrates at least some aspects of the one or more devices that may be provided at block 302 of the method 300. For instance, FIG. 4A shows a gate structure 408 including a main sidewall spacer 412. In some embodiments, the main sidewall spacer 412 may include a plurality of layers such as a first main spacer layer 412A and a second main spacer layer 412B. While the gate structures 108, 208 above were described as including metal layers, in some examples the gate structure 408 may initially include a polysilicon layer which is subsequently replaced by a high-K/metal gate layer, for example, as part of a gate-last process. To be sure, embodiments of the present disclosure may similarly be applied to devices fabricated using a gate-first process. The device 400 further illustrates a source/drain region 406, which may include an epitaxial source/drain region. In some embodiments, the source/drain region 406 has a recess depth 427 of about 30-50 nm. As previously discussed, the semiconductor material layer used to form the source/drain region 406 may include Ge, Si, SiGeB, GaAs, AlGaAs, SiGe, GaAsP, SiP, or other suitable material.

As noted above, the device 400 may include an ILD layer 415 through which an opening may be formed in order to make contact to the source/drain region 406. Thus, in some embodiments, the method 300 then proceeds to block 304, where contact openings are formed. With reference to the examples of FIGS. 4A and 4B, source/drain contact openings, such as contact opening 407, are formed to provide access to the source/drain region 406. By way of example, the contact opening 407 may be formed by a suitable combination of lithographic patterning and etching (e.g., wet or dry etching) processes of the overlying ILD layer (e.g., such as the ILD layer 415). For example, a photoresist layer 417 may be deposited (e.g., by spin-coating) and patterned to expose the ILD layer 415. Thereafter, the ILD layer 415 over the source/drain region 406 may be removed (e.g., by wet or dry etching) to expose the source/drain region 406. In some examples, the etching process used to remove the ILD layer 415 may etch a portion of the source/drain region 406 to form a recess 419 within the source/drain region 406. Alternatively, in some cases, a separate etching process may be performed after removal of the ILD layer 415 (e.g., to clean a surface of the exposed source/drain region 406), where the separate etching process may form the recess 419 within the source/drain region 406. In some examples, the recess 419 has a depth of about 3-5 nm. In some embodiments, portions of the CESL exposed as a result of formation of the contact opening 407 may also be removed (e.g., by wet or dry etching). In some embodiments, with reference to FIG. 4C and as a result of exposing the device 400 to atmospheric conditions (e.g., outside of a vacuum chamber used for processing), an oxidation layer 409 may be formed on a surface of the source/drain region 406. In some embodiments, the oxidation layer 409 may include a native oxide layer formed by the exposure to atmospheric conditions. In some embodiments, the oxidation layer 409 has a thickness 428 of about 15-20 Angstroms. As previously discussed, and in at least some conventional processes, formation of the source/drain contact openings may cause spacer loss (e.g., by unwanted etching of a portion of the main spacer 412), which can result in a gate-to-source/drain short. Also, in at least some conventional processes, a pre-amorphization implant (PAI), source/drain dopant implant (e.g., boron implant) followed by a source/drain anneal and a SiN spacer dep-etch process, silicide formation, and contact layer metal deposition over the now exposed source/drain region 406 may be performed at this stage. However, as discussed above, this can lead to undesirable dopant channeling (e.g., boron channeling) and Vt shift, as well as dep-etch induced boron dopant loss. Thus, as described in more detail below, embodiments of the present disclosure instead provide for performing a spacer dep-etch process prior to a source/drain doping process in order to prevent dep-etch induced dopant loss. In addition, a self-amorphizing PLAD process may be used to perform the source/drain doping process, rather than using a conventional ion implantation process, thereby resolving the tailing issue described above.

Thereafter, in some embodiments, the method 300 then proceeds to block 306 where a spacer deposition-etch (dep-etch) process is performed. Still with reference to FIG. 4C, a spacer layer 414 may be conformally deposited over the device 400. In some embodiments, the spacer layer 414 may be deposited by CVD, ALD, PVD, or other suitable process. In some examples, the spacer layer 414 may include a nitride layer, such as a SiN layer. In various examples, the deposited spacer layer 414 is used to compensate for the any spacer loss that may have occurred during the formation of the contact opening 407. After depositing the spacer layer 414, an etching process may be performed to remove portions of the spacer layer 414. For example, in some embodiments, the etching process may remove portions of the spacer layer 414 above the gate structure 408 and/or within the contact opening 407. In particular, the etching process may be used to form an opening 413 in the spacer layer 414 to provide access to the underlying source/drain region 406.

Figure 8:
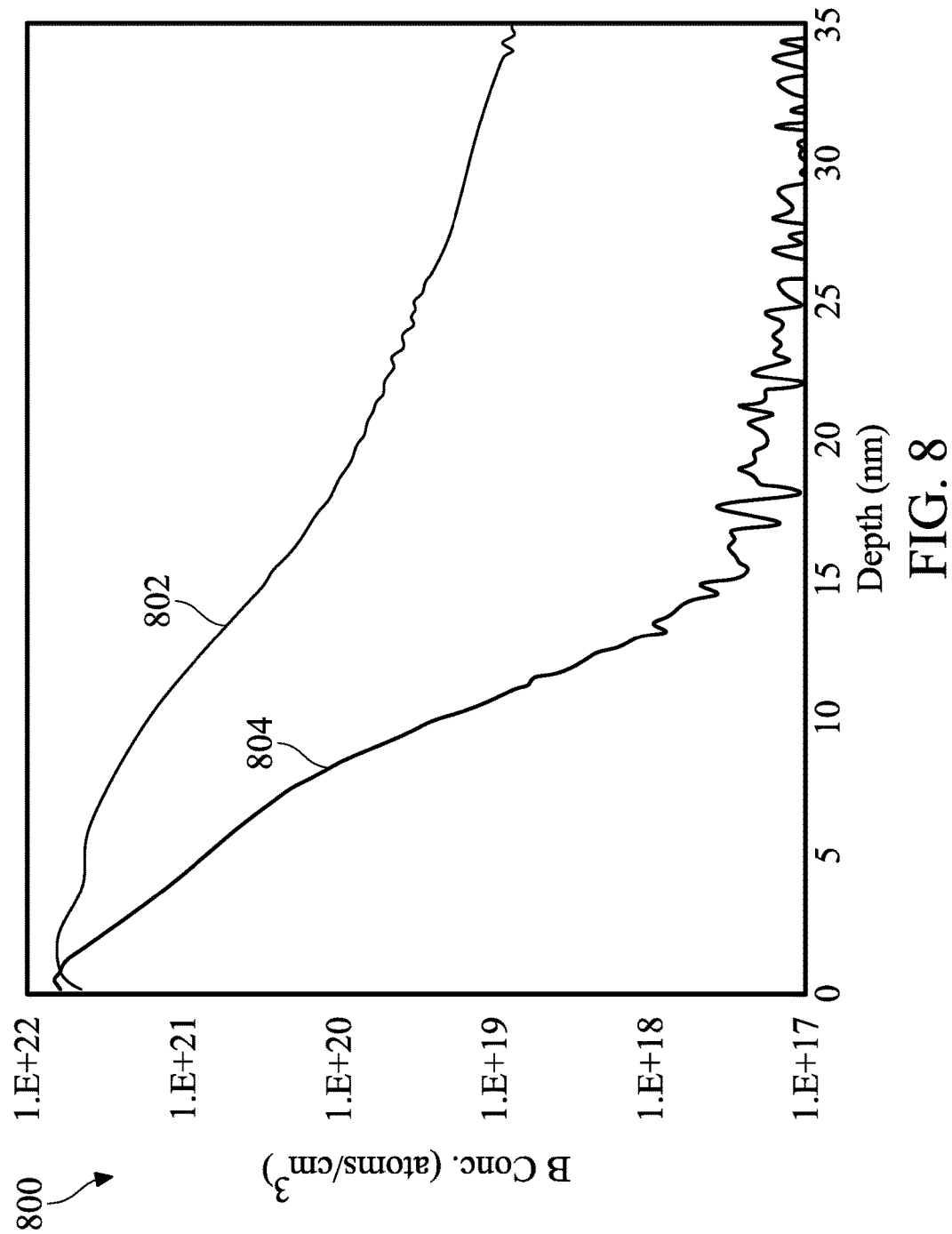
FIG. 8 illustrates exemplary secondary-ion mass spectrometry (SIMS) data including a SIMS profile for an ion-implantation process and a SIMS profile for a plasma doping (PLAD) process.

The method 300 then proceeds to block 308 where a plasma doping process is performed. With reference to FIG. 4D, a plasma doping (PLAD) process 422 may be performed to the device 400. In some embodiments, the PLAD process 422 serves to dope the source/drain region 406, rather than using conventional ion implantation which suffers from dopant tailing and Vt shift, as previously described. In some examples, the PLAD process 422 may be performed using a plasma power of about 0-3 kW, at a temperature from about room temperature to about 50° C., and at a pressure of about 6-20 mTorr. Additionally, and in some embodiments, the PLAD process 422 may be performed with an appropriate bias voltage so as to impart kinetic energy to ions and/or electrons within a plasma used for the PLAD process 422. By way of example, a bias voltage of about 0-1 kV may be applied during the PLAD process 422 to impart kinetic energy in a range of about 0-500 eV. In various embodiments, and at least in part because of the kinetic energy supplied by the bias voltage, the dopant implanted by the PLAD process 422 may pass through the oxidation layer 409 to dope the source/drain region 406. In some embodiments, for example when forming a PMOS device, the PLAD process 422 may be used for boron doping of the source/drain region 406. In some cases, the PLAD process 422 may include helium-diluted boron plasma ($B_2H_6$ or $BF_3$). In some examples, the helium-diluted boron plasma may be diluted with about 0.3-0.5% helium. In various examples, the PLAD process 422 also has a low activation energy, for example, because of the small mass of helium. In some examples, the PLAD process 422 may provide for a surface boron concentration of greater than about $1 \times 10^{21}$ atoms/cm$^3$ (e.g., at a top surface of the source/drain region 406) and a boron concentration greater than about $1 \times 10^{20}$ atoms/cm$^3$ at about 10 nm beneath the top surface of the source/drain region 406 (e.g., 10 nm into the source/drain region 406). In some embodiments, the surface boron concentration may be greater than about $2 \times 10^{21}$ atoms/cm$^3$. In some cases, a junction depth formed by the PLAD process 422 may be about 7 nm. In some embodiments, a junction depth formed by the PLAD process 422 may be about 9 nm. In some examples, the PLAD process 422 may provide for self-amorphization, surface peak concentration, and an abrupt doping profile. For purposes of illustration, FIG. 8 provides exemplary secondary-ion mass spectrometry (SIMS) data 800 including a SIMS profile 802 for an ion-implantation process and a SIMS profile 804 for a plasma doping (PLAD) process. As shown, the SIMS profile 802 for the ion-implantation process suffers from dopant tailing and threshold voltage shift. In contrast, the SIMS profile 804 for the PLAD process provides a high peak surface dopant concentration and an abrupt doping profile, thus avoiding dopant tailing and threshold voltage shift. Thus, embodiments disclosed herein eliminate the need for an additional Ge amorphization process step, as used in at least some conventional ion implantation processes. In addition, the PLAD process 422 provides for faster processing time, as compared to conventional ion implantation, because of the higher dose rate of the PLAD process 422.

In some embodiments, the method 300 proceeds to block 310 where an anneal process is performed. In some embodiments, the anneal process includes a laser anneal process. In some cases, the laser anneal includes a laser spike annealing (LSA) process or a dynamic surface annealing (DSA) process. By way of example, and in some embodiments, the anneal process may be performed at about 850 degrees Celsius. In some embodiments, the anneal process of block 310 is used for defect recovery and for dopant activation (e.g., of the dopant provided by the PLAD process). In general, laser annealing processes may be used to form ultra-shallow and highly activated junctions.

In some embodiments, the method 300 may then proceed to block 312 where a pre-silicide implant (e.g., ion implant) is performed. In various embodiments, the pre-silicide implant is used to improve subsequent silicide layer formation. By way of example, the pre-silicide implant may provide for a desired phase of the silicide layer. For instance, when using TiSi as the silicide layer, the pre-silicide implant may be used to provide C49-TiSi, C54-TiSi, or another desirable phase of TiSi. In some embodiments, the pre-silicide implant includes a germanium (Ge) pre-silicide implant. In some examples, the pre-silicide implant is performed at an energy of about 10 KeV and at a dose of about $5 \times 10^{13}$ atoms/cm$^2$. Thereafter, in some embodiments, the method 300 then proceeds to block 314, where a silicide layer is formed in contact with the source/drain region 406. In some cases, prior to formation of the silicide layer, an etching process is performed to remove the oxidation layer 409 at least within an area of the opening 413. In some embodiments, a fluorine-based plasma may be used to remove the oxidation layer within the area of the opening 413. Referring to the example of FIG. 4E, a silicide layer 424 is formed over and in contact with the source/drain region 406. In some embodiments, the silicide layer 424 has a thickness 429 of about 5-7 nm. In some examples, after formation of the silicide layer 424, a remaining thickness 430 of the source/drain region 406 is about 21-38 nm. In some cases, TiSi may be used as the silicide layer 424. In some examples, the silicide layer 424 may include CVD formed TiSi, utilizing a Si-based precursor. In some cases, the CVD-deposited TiSi deposited within other, unwanted regions (e.g., outside an area of the contact opening 407) may be removed by a CMP process (e.g., during a subsequent tungsten or cobalt CMP process). In some embodiments, the silicide layer 424 may also include a plurality of layers of the same or different material(s). In some examples, the silicide layer 424 may include the same or different material(s) for each of an N-type and P-type device. In some embodiments, the silicide layer 424 may include a dual silicide process and structure, where a first material is used for an N-type device, and a second material is used for a P-type device. For instance, in some cases, the silicide layer 424 may include TiSi, Yb-doped TiSi, Zn-doped TiSi, and/or Yb/Zn-doped TiSi, or TiSi for an N-type device. In addition, and in some embodiments, the silicide layer 424 may include NiSi, Pt-doped NiSi, or TiSi for a P-type device.

In some embodiments, the method 300 then proceeds to block 316, where a contact metal is formed over, and in contact with, the silicide layer formed at block 314. In some embodiments, the contact metal may include Ti, W, Co, Cu, Al, Mo, MoW, W, TiN, TaN, WN, silicides, combinations thereof, or other suitable conductive material. Thus, in some cases, the contact metal may include a plurality of layers. In some examples, the contact metal may be deposited in an opening 411 of the device 400 to contact the silicide layer 424. Alternatively, after formation of the silicide layer 424 and in some examples, an ILD layer may be deposited over the device 400 and patterned (e.g., by a suitable combination of lithographic patterning and wet and/or dry etching), to form openings that expose the silicide layer 424 and within which the contact metal is deposited. In some examples, after formation of the contact metal, a CMP process may be performed to remove excess material (e.g., excess material of the contact metal) and planarize a top surface of the device 400. Thereafter, in some embodiments and after formation of the silicide layer contact metal, an ILD layer may be deposited over the device 400 and patterned (e.g., by a suitable combination of lithographic patterning and wet and/or dry etching), to form openings that expose the contact metal and within which a VIA metal layer is deposited. In some embodiments, the VIA metal layer includes Ti, W, Co, Cu, Al, Mo, MoW, W, TiN, TaN, WN, silicides, combinations thereof, or other suitable conductive material. In some examples, after formation of the VIA, a CMP process may be performed to remove excess material (e.g., excess material of the VIA metal layer) and planarize a top surface of the device 400.

The semiconductor device 400 may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 300, and some process steps described above may be replaced or eliminated in accordance with various embodiments of the method 300.

While the method 300 discussed above is largely directed to doping of source/drain regions for PMOS devices, embodiments of the present disclosure additionally provide methods for doping the source/drain regions of NMOS devices, as discussed below with reference to methods 500 and 700. For example, some embodiments of the present disclosure use a P-type dopant (e.g., indium) for doping source/drain regions of NMOS devices, such that the P-type dopant may be implanted into both N-type and P-type regions simultaneously, thereby obviating the need for an extra mask during the doping process. As discussed above, using indium as a dopant provides several advantages such as: (i) being generally insoluble in silicon, (ii) providing a diffusion barrier for at least some dopants such as arsenic and phosphorous, and (iii) not forming a stable compound with titanium and acting as a catalyst for achieving a low-resistance TiSi phase transformation. In addition, because indium atoms are relatively large (e.g., as compared to Si), self-amorphization by the indium implantation process eliminates the need for a separate Ge amorphization process step for silicide formation (e.g., for TiSi formation).

Figure 5:
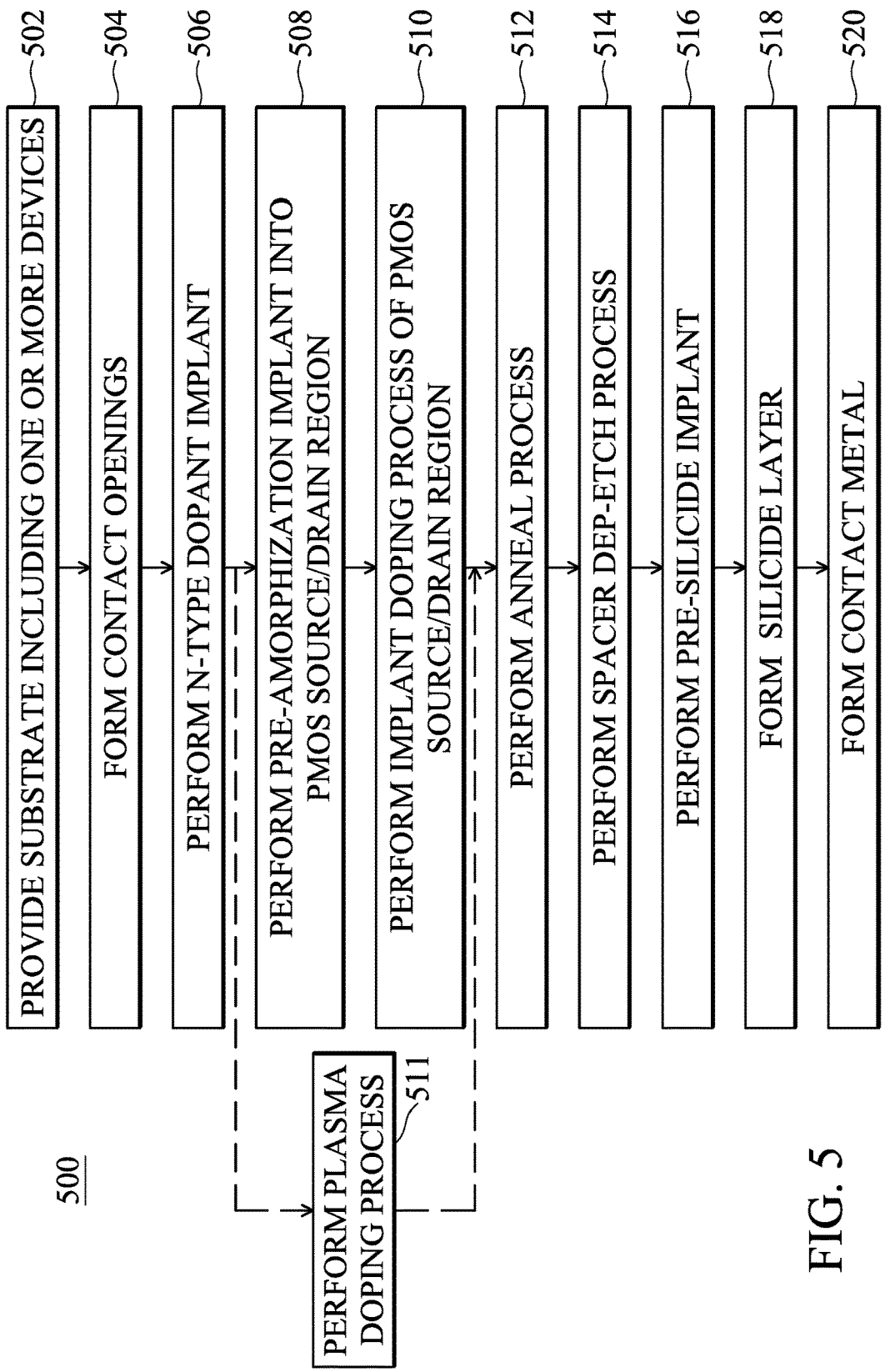
FIG. 5 is a flow chart of another method of fabricating a FinFET device according to one or more aspects of the present disclosure.

Referring now to FIG. 5, illustrated is a method 500 of fabricating a semiconductor device including a FinFET device. In particular, the method 500 provides methods for doping source and drain (S/D) regions of a PMOS and/or NMOS FinFET device to provide a reduced S/D contact resistance between subsequently formed silicide and metal contact layers. In some embodiments, the method 500 may be used to fabricate the device 100, described above with reference to FIG. 1. Thus, one or more aspects discussed above with reference to the device 100 may also apply to the method 500. Additionally, FIGS. 6A-6E provide cross-sectional views of an exemplary device 600 fabricated according to one or more steps of the method 500 of FIG. 5.

It is understood that parts of the method 500 and/or the semiconductor device 600 may be fabricated by a well-known CMOS technology process flow, and thus some processes are only briefly described herein. In addition, as described above, the device 600 may share aspects of the device 100, thus some aspects and/or processes of the device 600 are only discussed briefly for purposes of clarity in understanding. Also, the device 600 may share aspects of the device 200 or the device 400 described above, including both physical features and processing methods, thus some aspects and/or processes of the device 600 are only discussed briefly for purposes of clarity in understanding. Further, the semiconductor device 600 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 600 includes a plurality of semiconductor devices (e.g., transistors), which may be interconnected.

In various embodiments, the device 600 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Figure 6B:
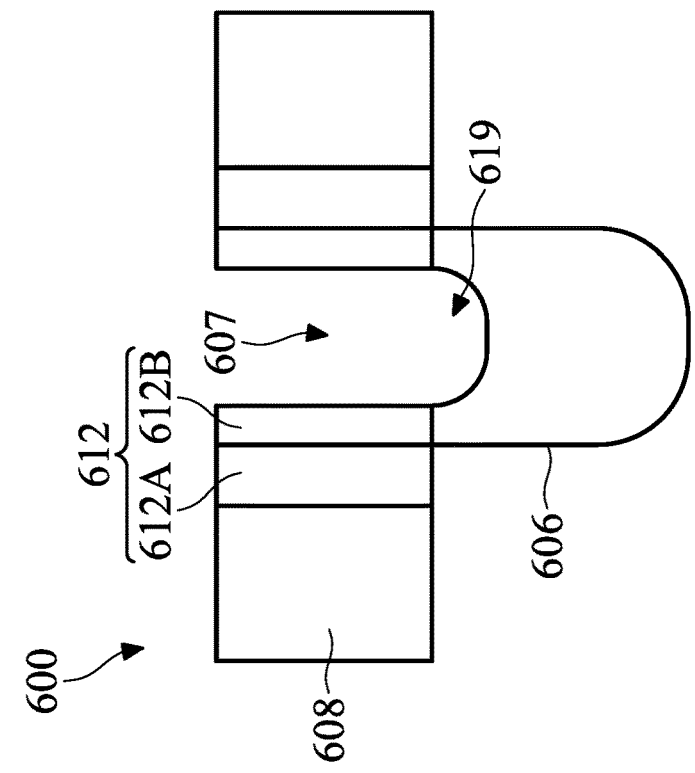
Figure 6A:
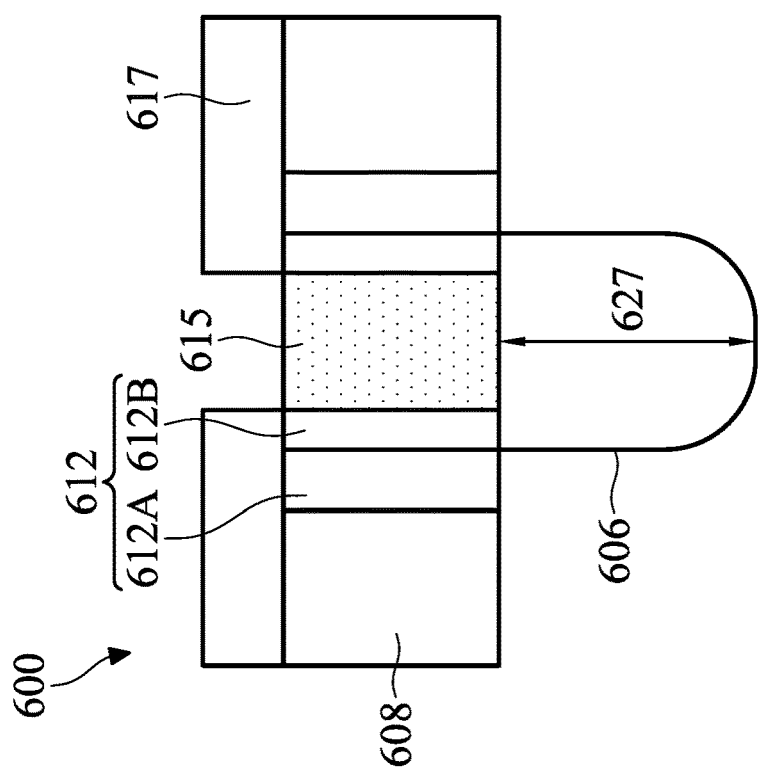

Referring now to the method 500, the method 500 begins at block 502 where a substrate including one or more devices is provided. In some embodiments, the one or more devices may include one or more FinFET devices having fin elements extending from the substrate, isolation regions to separate the one or more FinFET devices, a gate structure formed over a channel region of the fin elements, a main sidewall spacer formed on sidewalls of the gate structure, an ILD layer, and a source/drain feature, as described above with reference to FIG. 1 and FIG. 2. Referring to the example of FIG. 6A, the device 600 illustrates at least some aspects of the one or more devices that may be provided at block 502 of the method 500. For instance, FIG. 6A shows a gate structure 608 including a main sidewall spacer 612. In some embodiments, the main sidewall spacer 612 may include a plurality of layers such as a first main spacer layer 612A and a second main spacer layer 612B. As noted for the device 400, in some examples the gate structure 608 of the device 600 may initially include a polysilicon layer which is subsequently replaced by a high-K/metal gate layer, for example, as part of a gate-last process. The device 600 further illustrates a source/drain region 606, which may include an epitaxial source/drain region. In some embodiments, the source/drain region 606 has a recess depth 627 of about 30-50 nm. As previously discussed, the semiconductor material layer used to form the source/drain region 606 may include Ge, Si, SiGeB, GaAs, AlGaAs, SiGe, GaAsP, SiP, or other suitable material.

Similar to the device 400, the device 600 may include an ILD layer 615 through which an opening may be formed in order to make contact to the source/drain region 606. Thus, in some embodiments, the method 500 then proceeds to block 504, where contact openings are formed. With reference to the examples of FIGS. 6A and 6B, source/drain contact openings, such as contact opening 607, are formed to provide access to the source/drain region 606. By way of example, the contact opening 607 may be formed by a suitable combination of lithographic patterning and etching (e.g., wet or dry etching) processes of the overlying ILD layer. For example, a photoresist layer 617 may be deposited (e.g., by spin-coating) and patterned to expose the ILD layer 615. Thereafter, the ILD layer 615 over the source/drain region 606 may be removed (e.g., by wet or dry etching) to expose the source/drain region 606. In some examples, the etching process used to remove the ILD layer 615 may etch a portion of the source/drain region 606 to form a recess 619 within the source/drain region 606. Alternatively, in some cases, a separate etching process may be performed after removal of the ILD layer 615 (e.g., to clean a surface of the exposed source/drain region 606), where the separate etching process may form the recess 619 within the source/drain region 606. In some examples, the recess 619 has a depth of about 3-5 nm. In some embodiments, portions of the CESL exposed as a result of formation of the contact opening 607 may also be removed (e.g., by wet or dry etching). In some embodiments, with reference to FIG. 6C and as a result of exposing the device 600 to atmospheric conditions (e.g., outside of a vacuum chamber used for processing), an oxidation layer 609 may be formed on a surface of the source/drain region 606. In some embodiments, the oxidation layer 609 may include a native oxide layer formed by the exposure to atmospheric conditions. In some embodiments, the oxidation layer 609 has a thickness 628 of about 15-20 Angstroms.

The method 500 may then proceed to block 506 where an N-type dopant implant is performed. Still with reference to FIG. 6C, an N-type dopant implant process 602 may be performed to the device 600. In some embodiments, the implant process 602 serves to dope the source/drain region 606. In various embodiments, the dopant implanted by the implant process 602 may pass through the oxidation layer 609 to dope the source/drain region 606. In some embodiments, the implant process 602 may be used to implant various dopant species such as indium (In), arsenic (As), phosphorous (P), As+In, or P+In. In various embodiments, the implant process 602 may be used to implant the above dopant species into source/drain regions of both N-type and P-type device regions simultaneously, without masking either the N-type or P-type device regions during the implant process 602. By way of example, implantation of phosphorous by the implant process 602 may be performed at an energy of about 1-3 KeV and at a dose of about $1\times10^{15}$-$1\times10^{16}$ atoms/cm$^2$. Implantation of arsenic by the implant process 602 may be performed at an energy of about 1-4 KeV and at a dose of about $5\times10^{14}$-$5\times10^{15}$ atoms/cm$^2$. Implantation of indium by the implant process 602 may be performed at an energy of about 1-4 KeV and at a dose of about $5\times10^{13}$-$1\times10^{15}$ atoms/cm$^2$. In some embodiments, and as a result of the implant process 602, indium may segregate at a surface of the source/drain region 606 (e.g., above dashed line 621), while phosphorous and arsenic are trapped below the dashed line 621.

After performing the N-type dopant implant of block 506, and in some embodiments, the method 500 proceeds to block 508 where a pre-amorphization implant (PAI) is performed into a PMOS device region. Prior to performing the PAI, and in some cases, a masking layer (e.g., resist, nitride, oxide, etc.) may be formed over the NMOS device region to protect the NMOS device region during the implantation process. In various embodiments, the PAI is used to improve subsequent doping of the source/drain region 606. In some embodiments, the PAI includes a germanium (Ge) PAI. In some examples, the PAI is performed at an energy of about 10 KeV and at a dose of about $5 \times 10^{13}$ atoms/cm². In some embodiments, the method 500 proceeds to block 510 where an ion implant doping process is performed into the PMOS source/drain regions. In some embodiments, the ion implantation into the PMOS source/drain regions may include ion implantation of boron, gallium, or other appropriate P-type dopant.

In some embodiments, and as an alternative to blocks 508, 510 (e.g., which include conventional ion implantation processes), the method 500 may proceed instead to block 511 where a plasma doping process is performed. In some embodiments, such a plasma doping process may be substantially the same as described above with reference to FIG. 4D and the method 300. In some embodiments, the plasma doping process of block 511 may serve to dope the source/drain region 606 of PMOS devices. Thus, in some embodiments, the plasma doping process of block 511 may be used for boron doping of the source/drain region 606 of PMOS devices. As previously discussed, the plasma doping process may provide for self-amorphization, surface peak concentration, and an abrupt doping profile. Thus, embodiments disclosed herein eliminate the need for an additional Ge amorphization process step (e.g., block 508). To be sure, in some cases, a PAI (e.g., such as a Ge PAI) may optionally be used in conjunction with the plasma doping process.

Whether utilizing ion implantation doping processes (blocks 508, 510), a plasma doping process (block 511), or a combination thereof, the method 500 may then proceed to block 512 where an anneal process is performed. In some embodiments, the anneal process includes a laser anneal process, such as an LSA process or a DSA process. By way of example, and in some embodiments, the anneal process may be performed at about 850 degrees Celsius. In some embodiments, the anneal process of block 512 may be used for defect recovery and for dopant activation.

In some embodiments, the method 500 then proceeds to block 514 where a spacer deposition-etch (dep-etch) process is performed. With reference to FIG. 6D, a spacer layer 614 may be conformally deposited over the device 600. In some embodiments, the spacer layer 614 may be deposited by CVD, ALD, PVD, or other suitable process. In some examples, the spacer layer 614 may include a nitride layer, such as a SiN layer. In various examples, the deposited spacer layer 614 is used to compensate for the any spacer loss that may have occurred during the formation of the contact opening 607. After depositing the spacer layer 614, an etching process may be performed to remove portions of the spacer layer 614. For example, in some embodiments, the etching process may remove portions of the spacer layer 614 above the gate structure 608 and/or within the contact opening 607. In particular, the etching process may be used to form an opening 613 in the spacer layer 614 to provide access to the underlying source/drain region 606.

The method 500 may then proceed to block 516 where a pre-silicide implant (e.g., ion implant) is performed. In various embodiments, the pre-silicide implant may be as discussed above and is used to improve subsequent silicide layer formation. For example, when using TiSi as the silicide layer, the pre-silicide implant may be used to provide C49-TiSi, C54-TiSi, or another desirable phase of TiSi. In some embodiments, the pre-silicide implant includes a germanium (Ge) pre-silicide implant. In some examples, the pre-silicide implant is performed at an energy of about 10 KeV and at a dose of about $5 \times 10^{13}$ atoms/cm². Thereafter, in some embodiments, the method 500 then proceeds to block 518, where a silicide layer is formed in contact with the source/drain region 606. In some cases, prior to formation of the silicide layer, an etching process is performed to remove the oxidation layer 609 at least within an area of the opening 613. In some embodiments, a fluorine-based plasma may be used to remove the oxidation layer within the area of the opening 613. Referring to the example of FIG. 6E, a silicide layer 616 is formed over and in contact with the source/drain region 606. In some embodiments, the silicide layer 616 has a thickness 629 of about 5-7 nm. In some examples, after formation of the silicide layer 616, a remaining thickness 630 of the source/drain region 606 is about 21-38 nm. In some cases, TiSi may be used as the silicide layer 616. In some examples, the silicide layer 616 may include CVD formed TiSi, utilizing a Si-based precursor. In some cases, the CVD-deposited TiSi deposited within other, unwanted regions (e.g., outside an area of the contact opening 607) may be removed by a CMP process (e.g., during a subsequent tungsten or cobalt CMP process). In some embodiments, the silicide layer 616 may also include a plurality of layers of the same or different material(s). In some examples, the silicide layer 616 may include the same or different material(s) for each of an N-type and P-type device. In some embodiments, the silicide layer 616 may include a dual silicide process and structure, where a first material is used for an N-type device, and a second material is used for a P-type device, such as discussed above with reference to the silicide layer 424 of FIG. 4E.

In some embodiments, the method 500 then proceeds to block 520, where a contact metal is formed over, and in contact with, the silicide layer formed at block 518. In some embodiments, the contact metal may include Ti, W, Co, Cu, Al, Mo, MoW, W, TiN, TaN, WN, silicides, combinations thereof, or other suitable conductive material. Thus, in some cases, the contact metal may include a plurality of layers. In some examples, the contact metal may be deposited in an opening 611 of the device 600 to contact the silicide layer 616. Alternatively, after formation of the silicide layer 616 and in some examples, an ILD layer may be deposited over the device 600 and patterned (e.g., by a suitable combination of lithographic patterning and wet and/or dry etching), to form openings that expose the silicide layer 616 and within which the contact metal is deposited. In some examples, after formation of the contact metal, a CMP process may be performed to remove excess material (e.g., excess material of the contact metal) and planarize a top surface of the device 600. Thereafter, in some embodiments and after formation of the silicide layer contact metal, an ILD layer may be deposited over the device 600 and patterned (e.g., by a suitable combination of lithographic patterning and wet and/or dry etching), to form openings that expose the contact metal and within which a VIA metal layer is deposited. In some embodiments, the VIA metal layer includes Ti, W, Co, Cu, Al, Mo, MoW, W, TiN, TaN, WN, silicides, combinations thereof, or other suitable conductive material. In some examples, after formation of the VIA, a CMP process may be performed to remove excess material (e.g., excess material of the VIA metal layer) and planarize a top surface of the device 600.

The semiconductor device 600 may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more FinFET devices.

In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 500, and some process steps described above may be replaced or eliminated in accordance with various embodiments of the method 500.

Figure 7:
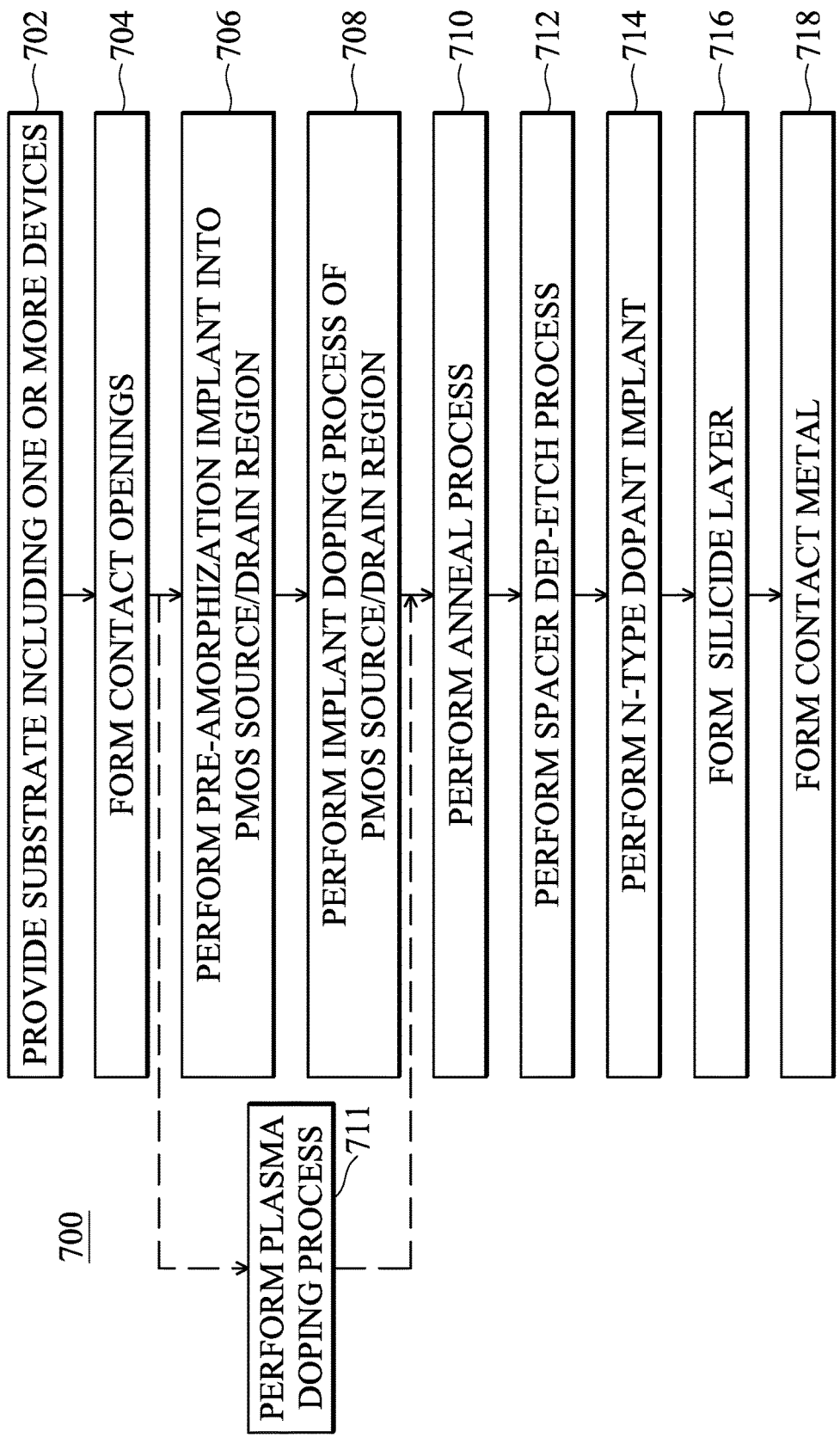
FIG. 7 is a flow chart of still another method of fabricating a FinFET device according to one or more aspects of the present disclosure.

With reference now to FIG. 7, illustrated is a method 700 of fabricating a semiconductor device including a FinFET device. In particular, the method 700 provides another method for doping source and drain (S/D) regions of a PMOS and/or NMOS FinFET device to provide a reduced S/D contact resistance between subsequently formed silicide and metal contact layers. In some embodiments, the method 700 may be used to fabricate the device 100, described above with reference to FIG. 1. Thus, one or more aspects discussed above with reference to the device 100 may also apply to the method 700. In general, the method 700 is substantially similar to the method 500. Thus, the method 700 is only briefly discussed while highlighting the differences between the method 700 and the method 500.

For example, the method 700 begins at block 702 where a substrate including one or more devices is provided, which is substantially the same as block 502 of the method 500. In some embodiments, the method 700 proceeds to block 704 where contact openings are formed, which is substantially the same as block 504 of the method 500. Instead of next performing an N-type dopant implant, as in block 506 of the method 500, the method 700 may instead proceed to block 706 where a PAI is performed into a PMOS device region, which is substantially the same as block 508 of the method 500. The method 700 may then proceed to block 708 where an ion implant doping process is performed into the PMOS source/drain regions, which is substantially the same as block 510 of the method 500.

In some embodiments, and as an alternative to blocks 706, 708 (e.g., which include conventional ion implantation processes), the method 700 may proceed instead to block 711 where a plasma doping process is performed, which is substantially the same as block 511 of the method 500. As mentioned above, in some cases, a PAI (e.g., such as a Ge PAI) may optionally be used in conjunction with the plasma doping process. Thereafter, and whether utilizing ion implantation doping processes (blocks 706, 708), a plasma doping process (block 711), or a combination thereof, the method 700 may then proceed to block 710 where an anneal process is performed, which is substantially the same as block 512 of the method 500. In some embodiments, the method 700 then proceeds to block 712 where a spacer deposition-etch (dep-etch) process is performed, which is substantially the same as block 514 of the method 500. Thereafter, in contrast to the method 500, the method 700 proceeds to block 714 where an N-type dopant implant is performed. In various aspects, the N-type dopant implant of block 714 may be substantially the same as the N-type dopant implant of block 506 of the method 500. As noted above, N-type dopant implant may be used to implant the N-type dopant species (e.g., indium (In), arsenic (As), phosphorous (P), As+In, or P+In) into both N-type and P-type device regions simultaneously, without masking either the N-type or P-type device regions during the N-type dopant implant. In addition, by performing the N-type dopant implant of block 714 just prior to formation of the silicide layer (block 716), the pre-silicide implant (e.g., such as the pre-silicide implant of block 516) may be eliminated.

Thus, after performing the N-type dopant implant (block 714), the method 700 may proceed to block 716 where a silicide layer is formed in contact with the source/drain region, substantially as described above with reference to block 518 of the method 500. Thereafter, the method 700 proceeds to block 718 where a contact metal is formed over, and in contact with, the silicide layer formed at block 716, substantially as described above with reference to block 520 of the method 500. Additional process steps may be implemented before, during, and after the method 700, and some process steps described above may be replaced or eliminated in accordance with various embodiments of the method 700.

The various embodiments described herein offer several advantages over the existing art. It will be understood that not all advantages have been necessarily discussed herein, no particular advantage is required for all embodiments, and other embodiments may offer different advantages. For example, embodiments discussed herein include methods for doping FinFET source and drain (S/D) regions to provide a reduced S/D contact resistance. For example, in some embodiments, a spacer deposition-etch (dep-etch) process may be performed prior to a source/drain doping process in order to prevent dep-etch induced dopant loss (e.g., dep-etch induced boron dopant loss for PMOS devices). In some cases, a PLAD process may be used to perform the source/drain doping process, rather than using a conventional ion implantation process. At least some embodiments disclosed herein eliminate the need for an additional Ge amorphization process step, as used in at least some conventional ion implantation processes. In addition, some embodiments of the present disclosure use a P-type dopant (e.g., indium) for NMOS devices, such that the P-type dopant may be implanted into both N-type and P-type regions simultaneously, thereby obviating the need for an extra mask during the doping process. In various cases, using indium as a dopant provides other advantages such as: (i) indium is generally insoluble in silicon and will diffuse out of silicon, thereby avoiding undesirable counter-doping and preventing the possible formation of a doped silicide layer (e.g., doped TiSi layer), (ii) indium-implanted surfaces provide a diffusion barrier for at least some dopants such as arsenic and phosphorous, thereby mitigating the formation of arsenic- or phosphorous-doped silicide (e.g., TiSi), and (iii) indium does not form a stable compound with titanium and acts as a catalyst for achieving a low-resistance TiSi phase transformation. In addition, because indium atoms are relatively large (e.g., as compared to Si), self-amorphization by the indium implantation process eliminates the need for a separate Ge amorphization process step for silicide formation (e.g., for TiSi formation). Additional embodiments and advantages are discussed below and/or will be evident to those skilled in the art in possession of this disclosure.

Thus, one of the embodiments of the present disclosure described a method where a substrate including a fin extending therefrom is provided. In some embodiments, the fin includes a channel region, source/drain regions disposed adjacent to and on either side of the channel region, a gate structure disposed over the channel region, and a main spacer disposed on sidewalls of the gate structure. In some examples, contact openings are formed to provide access to the source/drain regions, where the forming the contact openings etches a portion of the main spacer. After forming the contact openings, a spacer deposition and etch process may be performed. In some cases, after performing the spacer deposition and etch process, a silicide layer is formed over, and in contact with, the source/drain regions.

In another of the embodiments, discussed is a method where a substrate including a fin extending therefrom is provided. In some examples, the fin includes a channel region and source/drain regions disposed adjacent to and on either side of the channel region. In some embodiments, contact openings are formed to expose the source/drain regions. In various embodiments, after forming the contact openings, an N-type dopant implant is performed into the source/drain regions of both an N-type device region and a P-type device region simultaneously. After performing the N-type dopant implant, the N-type device region is masked and the source/drain regions of the P-type device region are doped. In some examples, after doping the source/drain regions of the P-type device region, a spacer deposition and etch process is performed. In some embodiments, after performing the spacer deposition and etch process, a silicide layer is formed over, and in contact with, the source/drain regions.

In yet another of the embodiments, discussed is a method where a substrate including a fin extending therefrom is provided. In some cases, the fin includes a channel region and source/drain regions disposed adjacent to and on either side of the channel region. In some embodiments, contact openings are formed to expose the source/drain regions. After forming the contact openings, and in some embodiments, an N-type region is masked and the source/drain regions of a P-type region are doped. In some examples, after doping the source/drain regions of the P-type device region, a spacer deposition and etch process is performed. In some embodiments, after performing the spacer deposition and etch process, an N-type dopant implant is performed into the source/drain regions of both the N-type region and the P-type region simultaneously.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    providing a substrate including a fin extending therefrom, wherein the fin includes a channel region, and wherein source/drain regions are disposed adjacent to and on either side of the channel region;
    forming contact openings to expose the source/drain regions;
    after forming the contact openings, performing a spacer deposition and etch process; and
    after performing the spacer deposition and etch process, forming a silicide layer over, and in contact with, the source/drain regions.

2. The method of claim 1, further comprising:
    after performing the spacer deposition and etch process, and before forming the silicide layer, performing a plasma doping process of the source/drain regions.

3. The method of claim 2, wherein the plasma doping process includes a boron plasma doping of the source/drain regions.

4. The method of claim 2, wherein the plasma doping process is a self-amorphizing plasma doping process.

5. The method of claim 2, further comprising after performing the plasma doping process, performing a laser anneal process.

6. The method of claim 1, further comprising:
    after performing the spacer deposition and etch process, and before forming the silicide layer, performing a pre-silicide implant.

7. The method of claim 1, further comprising:
    prior to forming the contact openings, depositing an interlayer dielectric (ILD) layer; and
    etching the ILD layer to form the contact openings.

8. The method of claim 1, wherein the spacer deposition and etch process includes conformally depositing a spacer layer, and after conformally depositing the spacer layer, etching the spacer layer to provide access to the source/drain regions.

9. The method of claim 8, wherein the spacer layer includes a silicon nitride (SiN) spacer layer.

10. The method of claim 1, wherein the semiconductor device includes a PMOS device.

11. A method, comprising:
    providing a substrate including a fin extending therefrom, wherein the fin includes a channel region, and wherein source/drain regions are disposed adjacent to and on either side of the channel region;
    forming contact openings to expose the source/drain regions;
    after forming the contact openings, performing an N-type dopant implant into the source/drain regions of both an N-type device region and a P-type device region simultaneously;
    after performing the N-type dopant implant, masking the N-type device region and doping the source/drain regions of the P-type device region;
    after doping the source/drain regions of the P-type device region, performing a spacer deposition and etch process; and
    after performing the spacer deposition and etch process, forming a silicide layer over, and in contact with, the source/drain regions.

12. The method of claim 11, wherein the doping the source/drain regions of the P-type device region further comprises:
    performing a pre-amorphization implant (PAI) into the P-type device region; and
    after performing the PAI, implanting a P-type dopant into the source/drain regions of the P-type device region.

13. The method of claim 11, wherein the doping the source/drain regions of the P-type device region further comprises:
    performing a boron plasma doping process of the source/drain regions of the P-type device region.

14. The method of claim 11, wherein the N-type dopant implant includes ion implantation of indium.

15. The method of claim 11, wherein the spacer deposition and etch process includes depositing a silicon nitride (SiN) spacer layer, and after depositing the SiN spacer layer, etching the spacer layer to provide access to the source/drain regions.

16. A method, comprising:
    providing a substrate including a fin extending therefrom, wherein the fin includes a channel region, and wherein source/drain regions are disposed adjacent to and on either side of the channel region;

forming contact openings to expose the source/drain regions;

after forming the contact openings, masking an N-type region and doping the source/drain regions of a P-type region; and after doping the source/drain regions of the P-type device region, performing a spacer deposition and etch process.

17. The method of claim 16, further comprising:

after performing the spacer deposition and etch process, performing an N-type dopant implant into the source/drain regions of both the N-type region and the P-type region simultaneously; and after performing the N-type dopant implant, forming a silicide layer over, and in contact with, the source/drain regions.

18. The method of claim 16, wherein the doping the source/drain regions of the P-type region further comprises:

performing a pre-amorphization implant (PAI) into the P-type region; and after performing the PAI, implanting a P-type dopant into the source/drain regions of the P-type region.

19. The method of claim 16, wherein the doping the source/drain regions of the P-type region further comprises:

performing a plasma doping process of the source/drain regions of the P-type region.

20. The method of claim 17, wherein the N-type dopant implant includes ion implantation of at least one of indium, arsenic, and phosphorous.

* * * * *